United States Patent
Chen et al.

(10) Patent No.: US 11,445,633 B2
(45) Date of Patent: Sep. 13, 2022

(54) TELECOMMUNICATION CABINET WITH HIDDEN ANTI-THEFT HEAT DISSIPATION MODULE

(71) Applicant: SUPER MICRO COMPUTER, INC., San Jose, CA (US)

(72) Inventors: Chia-Wei Chen, Taipei (TW); Tienen Chao, San Jose, CA (US)

(73) Assignee: SUPER MICRO COMPUTER, INC., San Jose, CA (US)

( * ) Notice: Subject to any disclaimer, the term of this patent is extended or adjusted under 35 U.S.C. 154(b) by 88 days.

(21) Appl. No.: 17/149,567

(22) Filed: Jan. 14, 2021

(65) Prior Publication Data
US 2022/0225534 A1 Jul. 14, 2022

(51) Int. Cl.
*H05K 7/20* (2006.01)
*H05K 5/02* (2006.01)
*E04H 1/14* (2006.01)

(52) U.S. Cl.
CPC .......... *H05K 7/20172* (2013.01); *E04H 1/14* (2013.01); *H05K 5/0204* (2013.01); *H05K 5/0213* (2013.01); *H05K 5/0239* (2013.01)

(58) Field of Classification Search
CPC ............. H05K 7/20172; H05K 7/0204; H05K 5/0204; H05K 5/0213; H05K 5/0239
See application file for complete search history.

(56) References Cited

U.S. PATENT DOCUMENTS

| | | | | |
|---|---|---|---|---|
| 5,467,250 A * | 11/1995 | Howard | ................. | H05K 7/206 165/122 |
| 6,164,369 A * | 12/2000 | Stoller | ............... | H05K 7/20572 165/104.34 |
| 6,889,752 B2 * | 5/2005 | Stoller | ................... | H05K 7/206 165/47 |
| 7,312,993 B2 * | 12/2007 | Bundza | .................. | H05K 7/206 165/122 |
| 7,619,160 B2 * | 11/2009 | Grunwald | .............. | H04Q 1/025 361/679.01 |
| 7,737,360 B2 * | 6/2010 | Wiemeyer | ................ | H04Q 1/13 361/679.01 |
| 8,432,685 B2 * | 4/2013 | Huang | ................. | H05K 5/0213 165/104.33 |
| 9,095,045 B2 * | 7/2015 | Rojo | ...................... | H04Q 1/025 |

(Continued)

FOREIGN PATENT DOCUMENTS

CN 208338068 U * 1/2019
CN 109462953 A * 3/2019 ........... H05K 5/0217

(Continued)

*Primary Examiner* — Abhishek M Rathod
*Assistant Examiner* — Keith DePew
(74) *Attorney, Agent, or Firm* — Beyer Law Group LLP

(57) ABSTRACT

A telecommunication cabinet with anti-theft function includes a cabinet body, a cabinet door, a fan module, and a plurality of coupling parts. The cabinet body includes a cabinet and a telecommunication module. The cabinet door covers the cabinet body and is provided with a snap hole. A bottom side of the cabinet door is provided with an installation opening. The fan module includes multiple fans and an elastic clip, and the elastic clip is provided with a bump. When the fan module is placed into the cabinet door from the installation opening, the bump is positioned in the snap hole. The fan module is coupled to the bottom side of the cabinet door.

13 Claims, 8 Drawing Sheets

(56) References Cited

U.S. PATENT DOCUMENTS

| | | | | |
|---|---|---|---|---|
| 9,155,221 | B2* | 10/2015 | Dolan | H05K 7/20 |
| 10,588,244 | B2* | 3/2020 | Chen | H05K 7/20618 |
| 11,083,102 | B1* | 8/2021 | Darche | H05K 7/023 |
| 11,172,586 | B2* | 11/2021 | Hermann | H05K 5/0095 |
| 11,306,739 | B2* | 4/2022 | Hong | F04D 29/601 |
| 2004/0007347 | A1* | 1/2004 | Stoller | H05K 7/206 165/47 |
| 2008/0037216 | A1* | 2/2008 | Liang | G06F 1/20 361/695 |
| 2008/0068798 | A1* | 3/2008 | Hendrix | H05K 7/206 361/692 |
| 2010/0002375 | A1* | 1/2010 | Yao | F04D 25/0613 361/679.49 |
| 2012/0298330 | A1* | 11/2012 | Mysse, III | H05K 7/206 165/96 |
| 2012/0298341 | A1* | 11/2012 | Fernandez | H05K 7/206 220/592.01 |
| 2013/0219947 | A1* | 8/2013 | Yang | F25D 31/00 62/426 |
| 2015/0282384 | A1* | 10/2015 | Ho | F16B 2/22 24/485 |
| 2015/0373874 | A1* | 12/2015 | Kinney | H05K 7/206 62/3.6 |
| 2016/0302326 | A1* | 10/2016 | Chen | H05K 7/20554 |
| 2019/0198834 | A1* | 6/2019 | Maloney | H04Q 1/14 |
| 2019/0312486 | A1* | 10/2019 | Yamamoto | H02K 11/33 |
| 2020/0096207 | A1* | 3/2020 | Kim | F24F 1/029 |
| 2020/0325905 | A1* | 10/2020 | Smailes | F04D 29/646 |
| 2020/0329577 | A1* | 10/2020 | Hermann | G08B 13/19632 |
| 2020/0370565 | A1* | 11/2020 | Odauchi | F04D 29/602 |
| 2021/0062828 | A1* | 3/2021 | Hong | F04D 29/646 |
| 2021/0148381 | A1* | 5/2021 | Hsu | F04D 9/002 |
| 2022/0104384 | A1* | 3/2022 | Chen | H05K 7/186 |
| 2022/0128289 | A1* | 4/2022 | Wang | F25D 23/003 |

FOREIGN PATENT DOCUMENTS

| | | |
|---|---|---|
| CN | 110167205 A | 8/2019 |
| CN | 210274364 U | 4/2020 |
| CN | 210431710 U | 4/2020 |

\* cited by examiner

TELECOMMUNICATION CABINET WITH HIDDEN ANTI-THEFT HEAT DISSIPATION MODULE

BACKGROUND OF THE INVENTION

Technical Field

The technical field relates to a telecommunication cabinet, and more particularly relates to a telecommunication cabinet with hidden anti-theft heat dissipation module.

Description of Related Art

Telecommunications is evolving from the 4G to the 5G era. With the increase of mobile users' demand for network bandwidth and speed, small cells are commonly utilized to deploy Ultra-Dense Networks (UDN) in order to meet these heightened requirements.

However, 5G base stations have higher power consumption than 4G base stations, such that a heat dissipation module may be arranged on the cabinet door to dissipate the heat of the communication electronic parts in the cabinet. In addition, the millimeter wave used by 5G technology is susceptible to interference and interruption. Therefore, current plans for 5G base stations call for installation in high places such as telecommunication poles, signal poles, street lamp poles, or elevated bridges, in order to reduce space requirements and to avoid interference or interruption. Since the overall weight and volume of the base station are large, it is not easy to install at such elevations. In addition, the related heat dissipation module in existing 5G base station designs is fastened with multiple screws from the outer side of the cabinet, which can easily be removed by unauthorized persons. As such, the dissipation module is vulnerable to theft, which could result in excess heat-related damage to the telecommunications equipment within, causing significant harm to the owner.

In view of the above drawbacks, the inventor proposes this disclosure based on his expert knowledge and elaborate research in order to solve the problems in the prior art.

SUMMARY OF THE INVENTION

It is an objective of this disclosure to provide a telecommunication cabinet with a hidden anti-theft heat dissipation module, in which the fan module is fastened with coupling parts from the inside of the cabinet door, so as to prevent the fan module from being stolen from the outside of the cabinet door while improving ease of installation.

In order to achieve the objective mentioned above, this disclosure provides a telecommunication cabinet including a cabinet body, a cabinet door, a fan module, and a plurality of coupling parts. The cabinet body includes a cabinet and a telecommunication module disposed in the cabinet. The cabinet door covers the cabinet body. The cabinet door includes an inner side adjacent to the cabinet and an outer side located oppositely. The cabinet door includes a plurality of coupling holes disposed on the inner side and a snap hole disposed on the outer side, and a bottom side of the cabinet door is provided with an installation opening. The fan module includes a supporting frame, a plurality of fans arranged in the supporting frame and at least one elastic clip. The supporting frame includes a front side attached to the cabinet door and a rear side located oppositely. At least one elastic clip is fixed on the front side of the supporting frame and provided with a bump for engaging the snap hole, and the supporting frame is provided with a plurality of frame holes on the rear side. The coupling parts are inserted in each of the coupling holes and each of the frame holes separately, wherein, the at least one elastic clip is pressed when the fan module is placed into the cabinet door from the installation opening, so that the bump is positioned in the snap hole. The coupling parts are fastened in the frame holes from the coupling holes on the inner side of the cabinet door, thereby the fan module is coupled to the bottom side of the cabinet door.

Compared to the related art, the telecommunication cabinet with hidden anti-theft heat dissipation module of this disclosure is provided with a cabinet door and a fan module, in which the front side of the cabinet door has a snap hole, and the supporting frame of the fan module includes an elastic clip having a bump. When the fan module is placed into the cabinet door, one side of the fan module is positioned through the bumps of the elastic clips to engage with the snap holes. In addition, the rear side of the cabinet door is provided with coupling holes and the rear side of the supporting frame is provided with frame holes. Thus, the other side of the fan module may be fixed through the coupling parts inserted in coupling holes and the frame holes. The fan module may therefore be easily coupled to the bottom side of the cabinet door. Furthermore, since the fan module is fastened with the coupling parts from the inner side of the cabinet door, even if the elastic clip is pressed to disengage the bump from the snap hole, the other side of the fan module will still be fixed. This protects the fan module from being stolen from the outside of the cabinet door.

BRIEF DESCRIPTION OF DRAWINGS

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE PREFERRED EMBODIMENTS

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
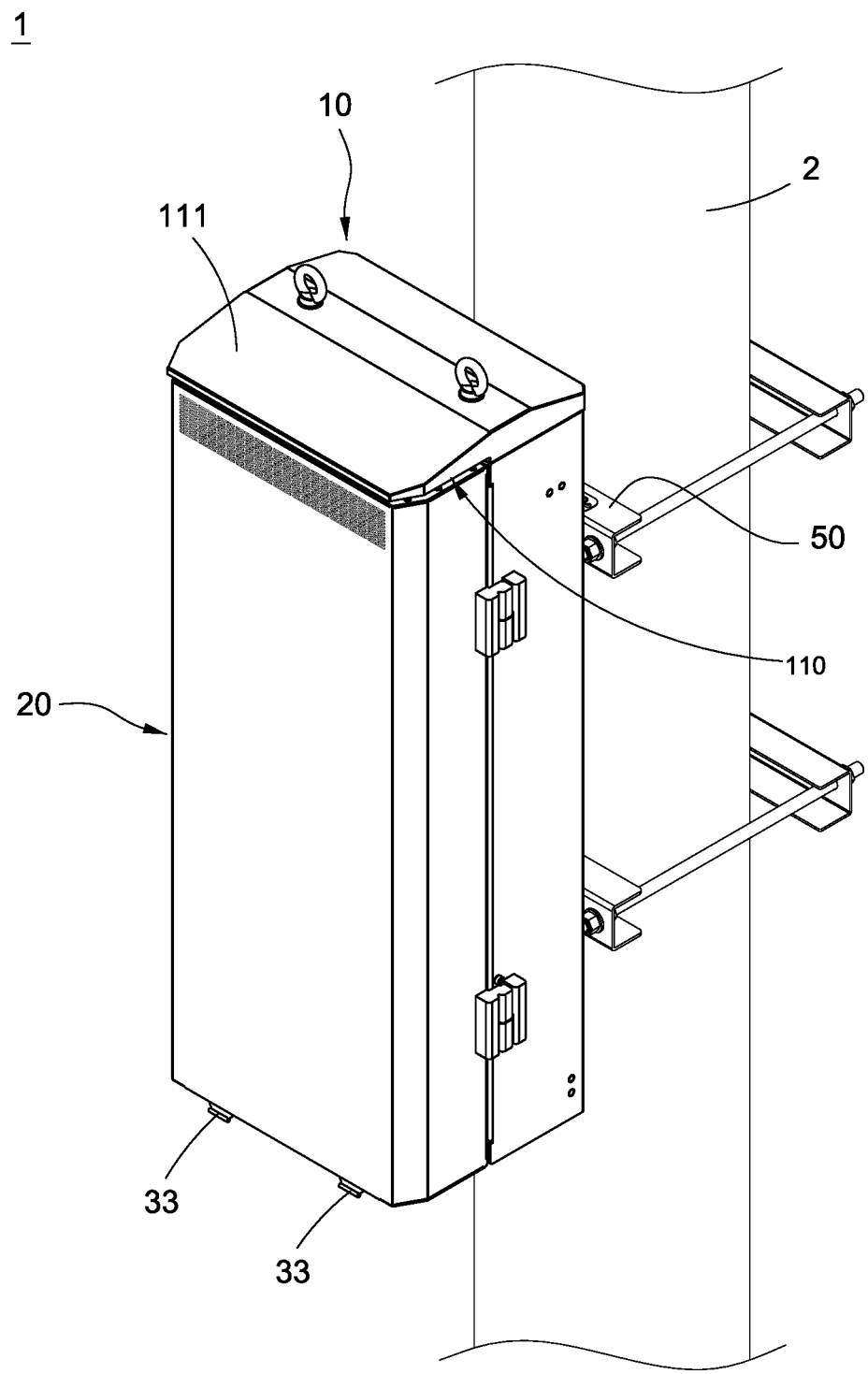
FIG. 1 is a perspective schematic view of the telecommunication cabinet with hidden anti-theft heat dissipation module of this disclosure.
Figure 2:
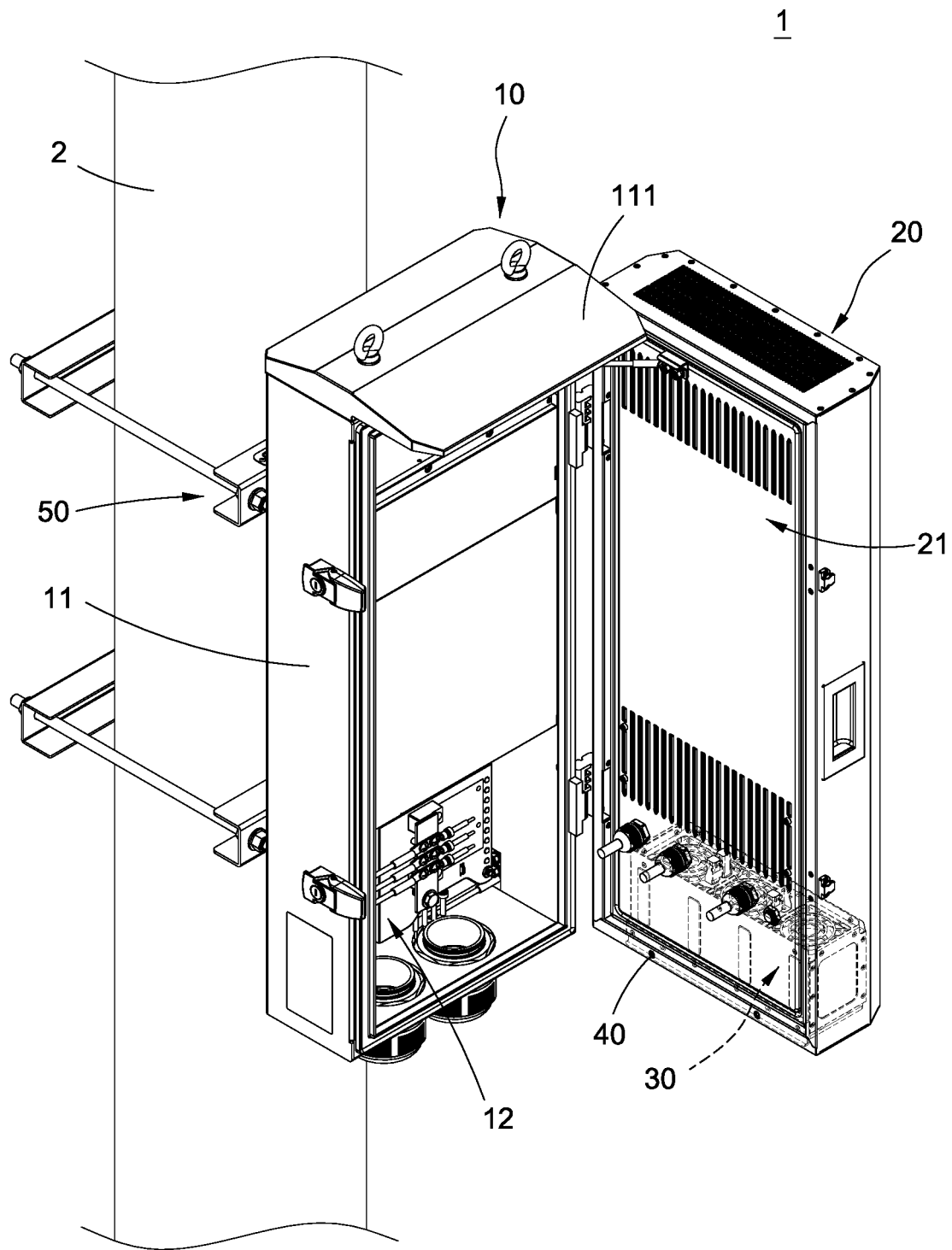
FIG. 2 is an opening schematic view of the telecommunication cabinet with hidden anti-theft heat dissipation module of this disclosure.
Figure 3:
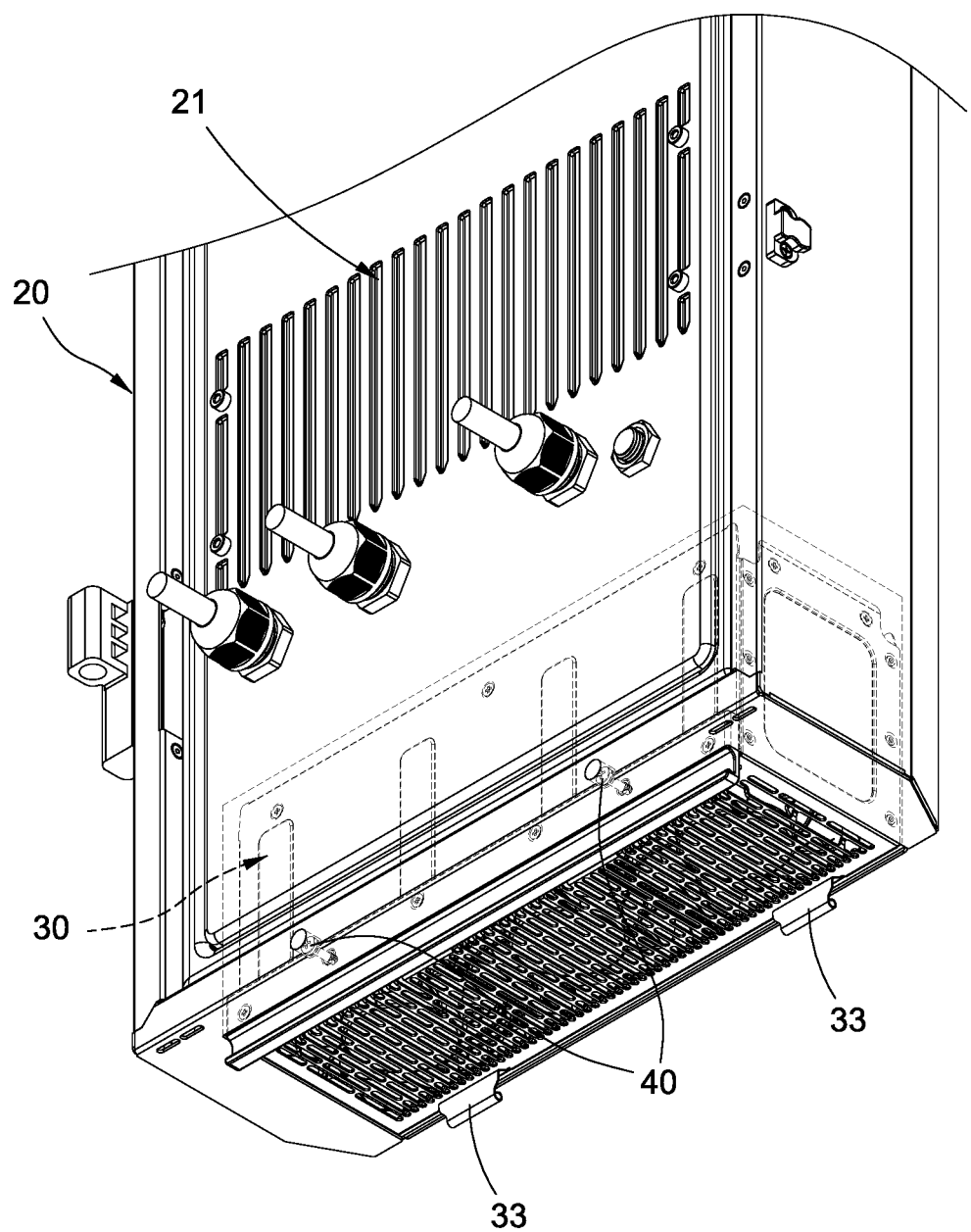
FIG. 3 is a partial enlarged schematic view of cabinet door of the telecommunication cabinet with hidden anti-theft heat dissipation module of this disclosure.

Please refer to FIG. 1 through FIG. 3, which depict a perspective schematic view of a cabinet door of a telecommunication cabinet with a hidden anti-theft heat dissipation module, a perspective schematic view of the cabinet door of the telecommunication cabinet in opened status, and a partial enlarged schematic view of the cabinet door of the telecommunication cabinet focusing on the hidden anti-theft heat dissipation module of this disclosure. The telecommunication cabinet 1 includes a cabinet body 10, a cabinet door 20, a fan module 30 and a plurality of coupling parts 40. The fan module 30 is fixed to the cabinet door 20 through the coupling parts 40. The telecommunication cabinet 1 is configured by the cabinet door 20 covering the cabinet body 10.

In one embodiment of this disclosure, the cabinet body 10 includes a cabinet 11 and a telecommunication module 12 disposed in the cabinet 11. Preferably, a plurality of telecommunication modules 12 are provided inside of the cabinet 11, and the cabinet 11 is substantially of a rectangular shape. The telecommunication modules 12 are network communication modules such as including power amplifier, switching rectifier, splitter, power converter and other electronic component, and the aforementioned components may be arranged according to actual needs.

The cabinet door 20 covers the cabinet body 10 correspondingly. In this embodiment, the cabinet door 20 is provided with a heat exchanging device 21. The heat exchanging device 21 is provided to dissipate heat of the telecommunication module 12. In addition, the bottom of the heat exchanging device 21 is additionally provided with the fan module 30. The fan module 30 is fixed to the bottom side of the cabinet door 20 through the coupling parts 40.

Please refer to FIG. 1 and FIG. 2. A top of the cabinet 11 is provided with a convex plate 111, and the convex plate 111 protrudes to top of the cabinet door 20, and a gap 110 is disposed between the convex plate 111 and the cabinet door 20 (for example, the convex plate 111 and the cabinet door module 20 are spaced apart with the gap 110). It should be noted that the gap 110 may be used for heat dissipation, and the convex plate 111 may shield the cabinet door 20 to prevent rain or external objects from falling into the cabinet door 20. Thus, the service life of the cabinet door 20 may be extended.

In this embodiment, the telecommunication cabinet 1 further includes a pair of brackets 50, and the pair of brackets 50 are connected on the rear side of the cabinet 11. The telecommunication cabinet 1 is attached to a fixed object 2 through the pair of brackets 50. The fixed object 2 may be a supporting pole such as a telecommunication pole, a signal pole, a street lamp pole, or an elevated bridge etc. Therefore, the telecommunication cabinet 1 may not occupy ground space, and the millimeter waves emitted from the telecommunication cabinet 1 may be protected from interference by other electronic devices or blocking by the building.

Figure 4:
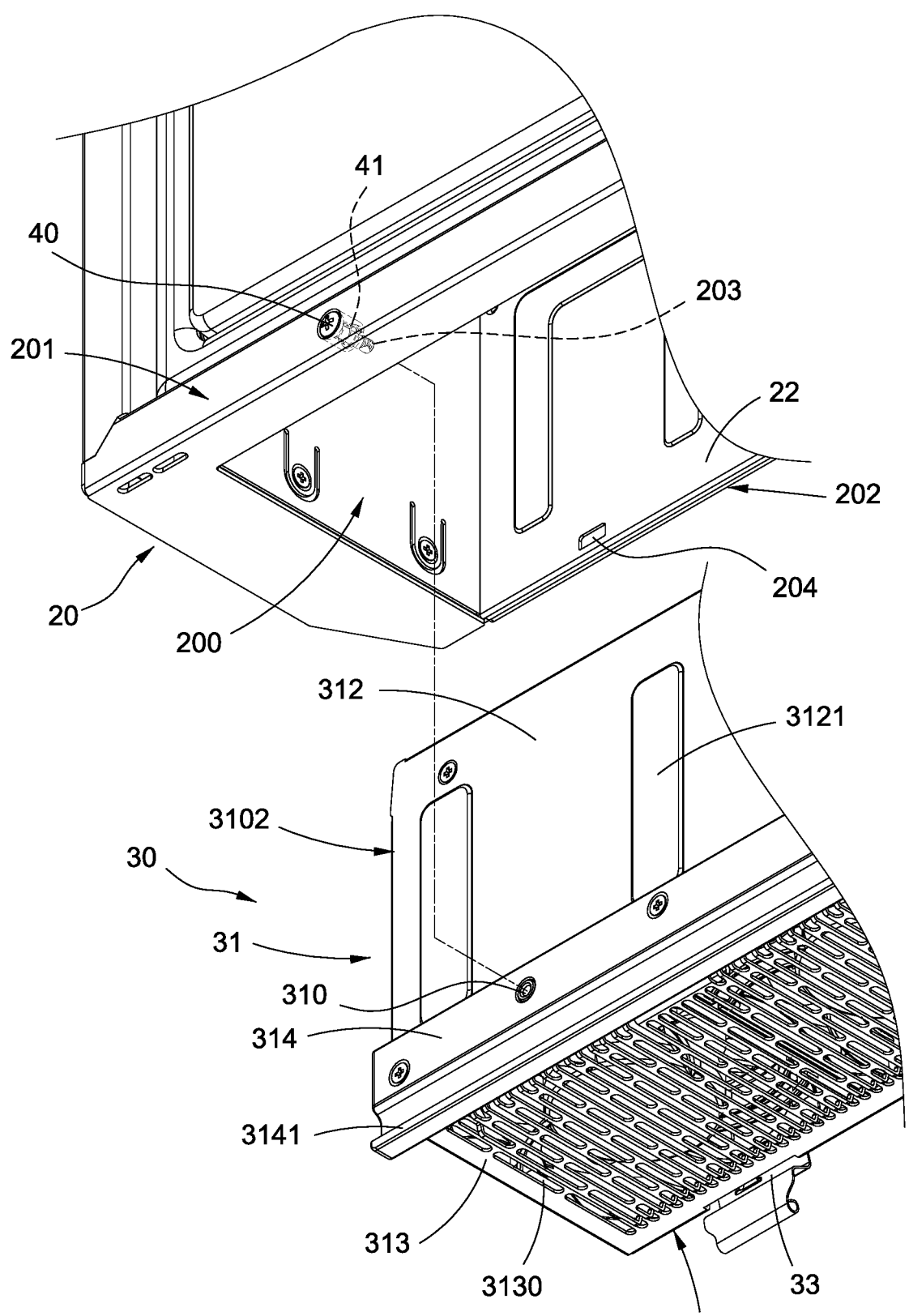
FIG. 4 and FIG. 5 are two perspective exploded views of the cabinet door and fan module of this disclosure.
Figure 5:
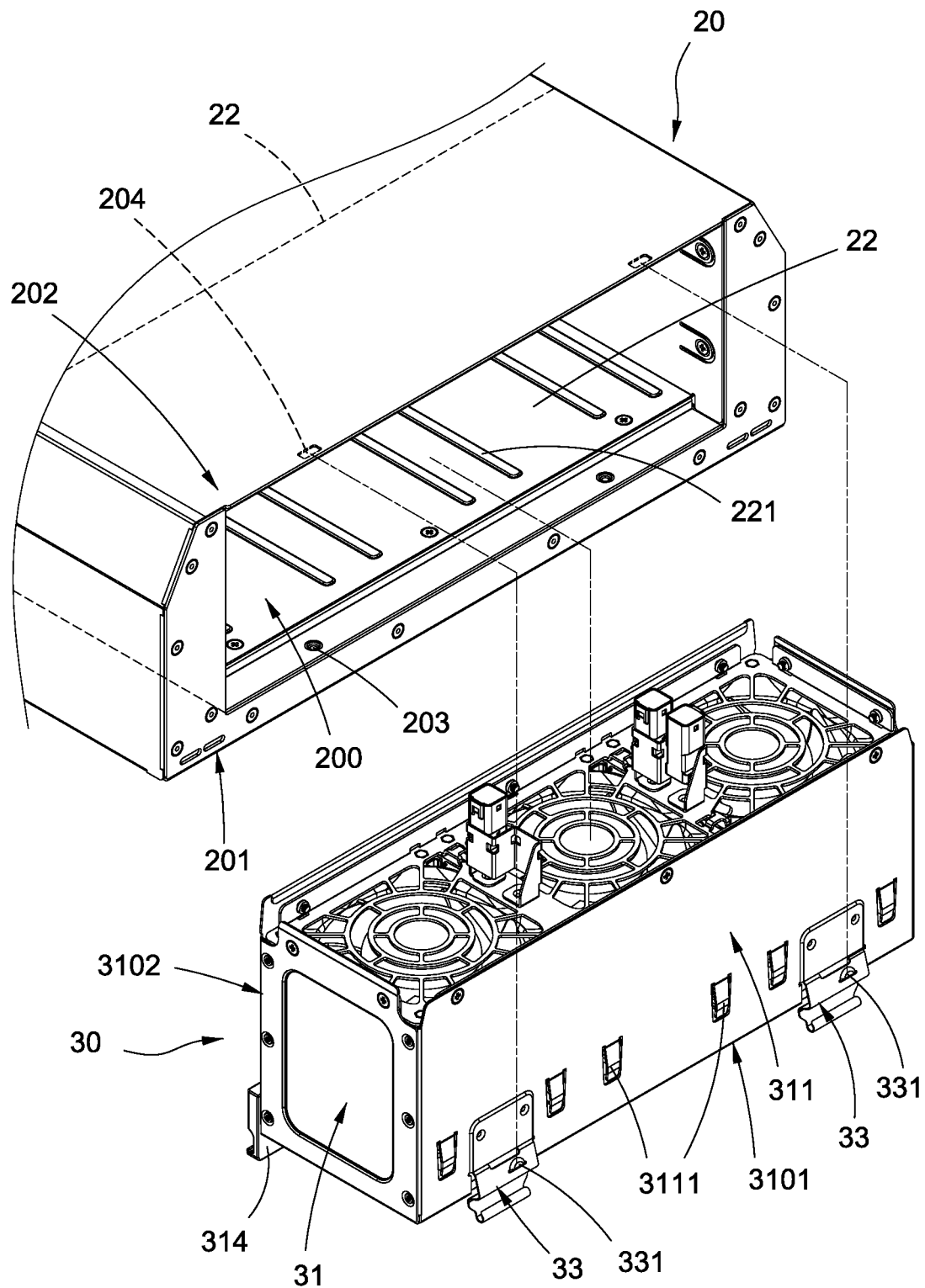
Figure 6:
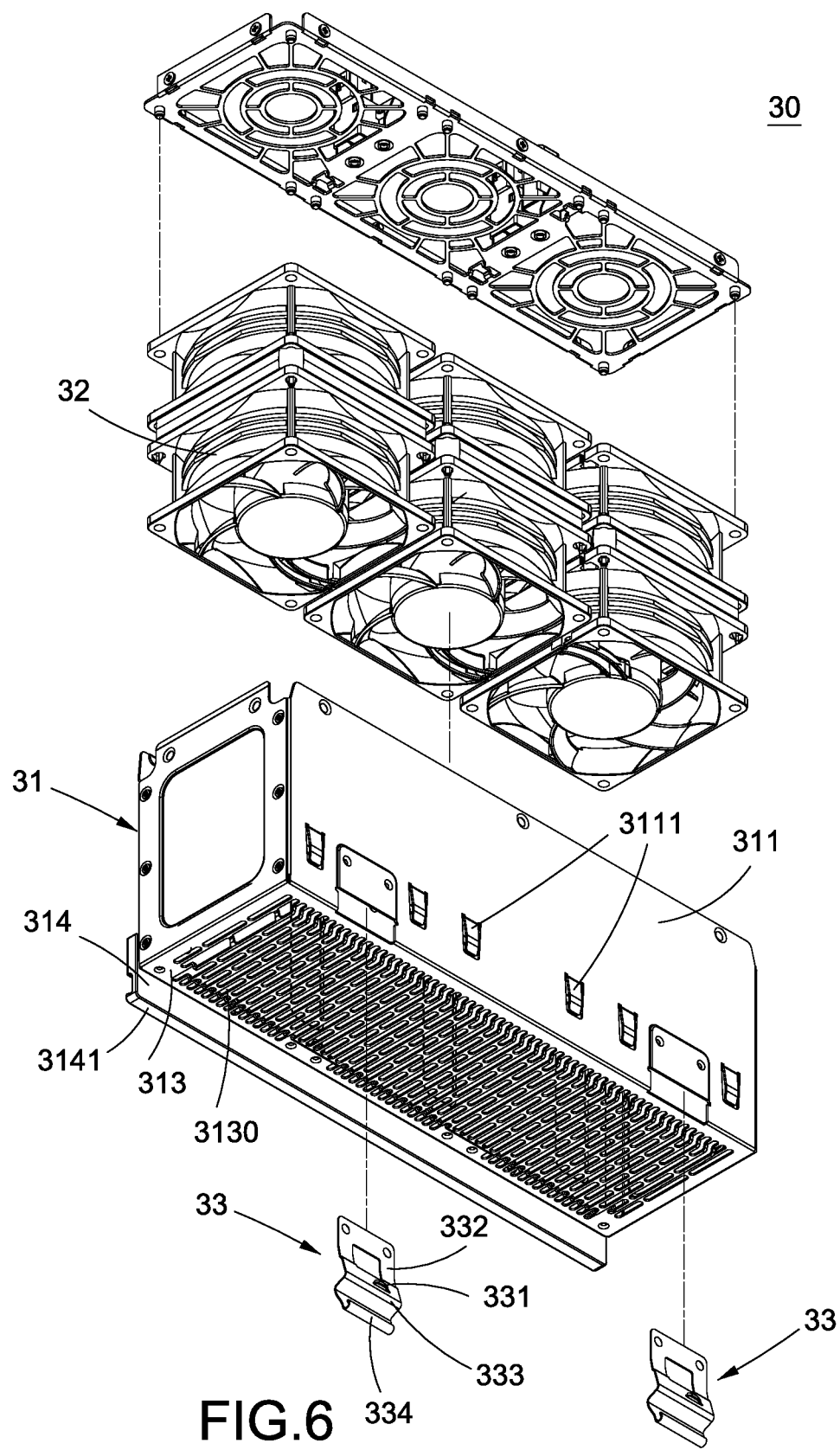
FIG. 6 is a perspective exploded view of the fan module of this disclosure.

Please further refer to FIG. 4 to FIG. 6, which depict the perspective exploded views of the cabinet door and the fan module of this disclosure and a perspective exploded view of the fan module of this disclosure. With referring to FIG. 4 and FIG. 5, the cabinet door 20 includes an inner side 201 adjacent to the cabinet 11 and an outer side 202 located oppositely (i.e., the outer side 202 is located opposite to the inner side 201). The cabinet door 20 includes a plurality of coupling holes 203 disposed on the inner side 201 and a snap hole 204 disposed on the outer side. In addition, a bottom side of the cabinet door 20 is provided with an installation opening 200. It is worth noting that in this embodiment, the inner wall of the cabinet door 20 is provided with a plurality of sustaining plates 22. The coupling holes 203 are disposed on the sustaining plate 22 on the inner side 201 of the cabinet door 20, and the snap hole 204 is disposed on the sustaining plate 22 on the outer side 202 of the cabinet door 20. Therefore, the snap hole 204 may not be seen from the outside of the cabinet door 20, so as to enhance the overall aesthetics of the telecommunication cabinet 1.

Moreover, the fan module 30 includes a supporting frame 31, a plurality of fans 32 arranged in the supporting frame 31 and at least one elastic clip 33. The supporting frame 31 includes a front side 3101 attached to the cabinet door 20 and a rear side 3102 located oppositely (i.e., the front side 3101 is located opposite to the rear side 3102). Besides, the elastic clip 33 is fixed on the front side 3101 of the supporting frame 31 and provided with a bump 331 (first bump) for engaging the snap hole 204. The supporting frame 31 is provided with a plurality of frame holes 310 on the rear side 3102.

When the fan module 30 is placed into the cabinet door 20 from the installation opening 200, the elastic clip 20 is pressed so that the bump 331 is positioned in the snap hole 204 to locate one side of the fan module 30. Furthermore, the coupling parts 40 are inserted separately in each of the coupling holes 203 and each of the frame holes 310 to locate the other side of the fan module 30. Therefore, the fan module 30 may be coupled to the bottom side of the cabinet door 20 without shifting.

Please refer to FIG. 4. Specifically, the coupling parts 40 may be spring screws. The cabinet door 20 is provided with a coupling tube 41 on the inner side 201 corresponding with each of the coupling holes 203, and the coupling parts 40 are inserted in the coupling tube 41. When the coupling parts 40 are unloaded from the frame holes 310 at high altitude, the screw heads of the coupling parts 40 may be moved relative to the cabinet door 20 and kept in the coupling tube 41. Therefore, the coupling parts 40 may not be separated from the inner side 201 of the cabinet door 20 when they are unloaded from the frame holes 310, so as to prevent the coupling parts 40 from falling and being lost at high altitude.

When the fan module 30 is being fastened, the coupling parts 40 are fastened in the frame holes 310 from the coupling holes 203 on the inner side 201 of the cabinet door 20 at high altitude, and the fan module 30 is coupled to the bottom side of the cabinet door 20. It should be noted that since the screw head of the coupling part 40 is pre-accommodated in the coupling tube 41, it is more convenient for users to perform locking operations at high altitude.

It is worth noting that the fan module 30 of the telecommunication cabinet 1 of this disclosure is fastened with the coupling parts 40 from the inner side 201 of the cabinet door 20. Therefore, even if the elastic clip 33 is pressed by an external force to make the bump 331 on one side of the fan module 30 separate from the snap hole 204, the other side of the fan module 30 is still fastened and the fan module 30 may not be removed from the cabinet door 20. Thus, the fan module 30 may be protected from theft from the outside of the cabinet door 20.

In more detail, the supporting frame 31 includes a first supporting plate 311 located on the front side 3101, a second supporting plate 312 located on the rear side 3102 and an air outlet plate 313 connected between the first supporting plate 311 and the second supporting plate 312. The air outlet plate 313 includes a plurality of vent holes 3130.

The supporting frame 31 may further connect with a mounting plate 314, and a fold section 3141 is formed on a bottom side of the mounting plate 314. In this embodiment, the frame holes 310 are arranged on the mounting plate 314. When the elastic fastener 20 is pressed to assemble the fan module 30 into the cabinet door 20, user may press the elastic clip 20 with one hand, and exert force on the folding section 3141 with the other hand for user holding two sides of the supporting frame 31 to perform operations of installation, fastening or detaching.

In this embodiment, the first supporting plate 311 includes a plurality of supporting tabs 3111 disposed spacedly. The supporting tabs 3111 elastically abut against the inner walls of the cabinet door 20. When the fan module 30 is placed into the cabinet door 20, the supporting tabs 3111 may support the weight of the fan module 30 to avoid the fan module 30 falling from the installation opening 200 because of its own weight. Preferably, the number of the elastic clip 33 is two, and two elastic clips 33 are disposed spacedly on the first supporting plate 311 and located between any two supporting tabs 3111.

Please refer to FIG. 4 and FIG. 5. In this embodiment, the second supporting plate 312 is formed with a plurality of bumps (second bumps) 3121, and the supporting plate 22 located on the inner side 201 of the cabinet door 20 includes a plurality of rails 221 arranged spacedly. When the fan module 30 is assembled into the cabinet door 20, the bumps 3121 may move along the rails 221 for increasing the stability during installation.

As shown in FIG. 6, the elastic clip 33 includes a riveting section 332 and a bending section 333. In this embodiment, the riveting section 332 is fixed on the first supporting plate 311 in a manner of rivet, and the bending section 333 is provided with the bump 331. Preferably, an end of the bending section 333 is provided with a pressing portion 334 in a curved shape. The pressing portion 334 is provided for users to exert force to deform the bending section 333. Thus, the bump 331 may easily engage with or detach from the snap hole 204 to install or remove the fan module 30 respectively.

Moreover, in this embodiment, the fans 32 of the fan module 30 are axial fans, and the vent holes 3130 of the air outlet plate 313 are disposed correspondingly to the airflow direction of the fans 32. Accordingly, the forcible airflow generated from the fan module 30 may expel the heat of the telecommunication module 12 from the vent holes 3130 to achieve the purpose of heat dissipation.

It is worth noting that since the telecommunication cabinet 1 of this disclosure may be attached to a high place, assembling the fan module 30 into the cabinet door 20 from the bottom side of the cabinet door 20 may be laborsaving and increase the convenience of installation. When the fan module 30 is being assembled, the elastic clip 33 is positioned on the snap hole 204 of the cabinet door 20 to pre-position the fan module 30 on the bottom side of the cabinet door 20. At this time, the supporting tabs 3111 of the fan module 30 may elastically abut against the cabinet door 20 to support the weight of the fan module 30 and prevent the fan module from falling because of its own weight. Therefore, a user needs not hold the fan module 30 while locking the coupling parts 40. The time for assembling the fan module 30 at a high altitude may be reduced, and the convenience of assembly is enhanced.

Figure 7:
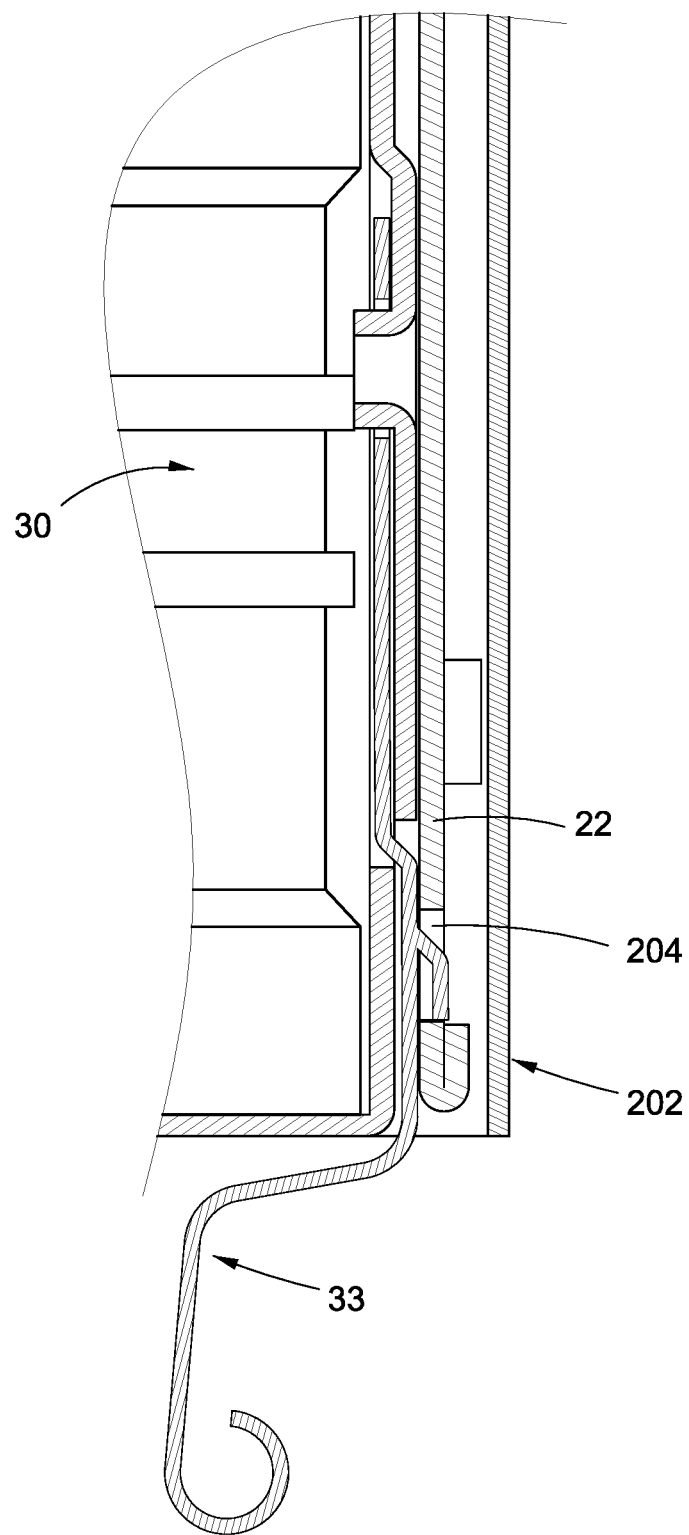
FIG. 7 and FIG. 8 are the cross-sectional views of the cabinet door and fan module of this disclosure.
Figure 8:
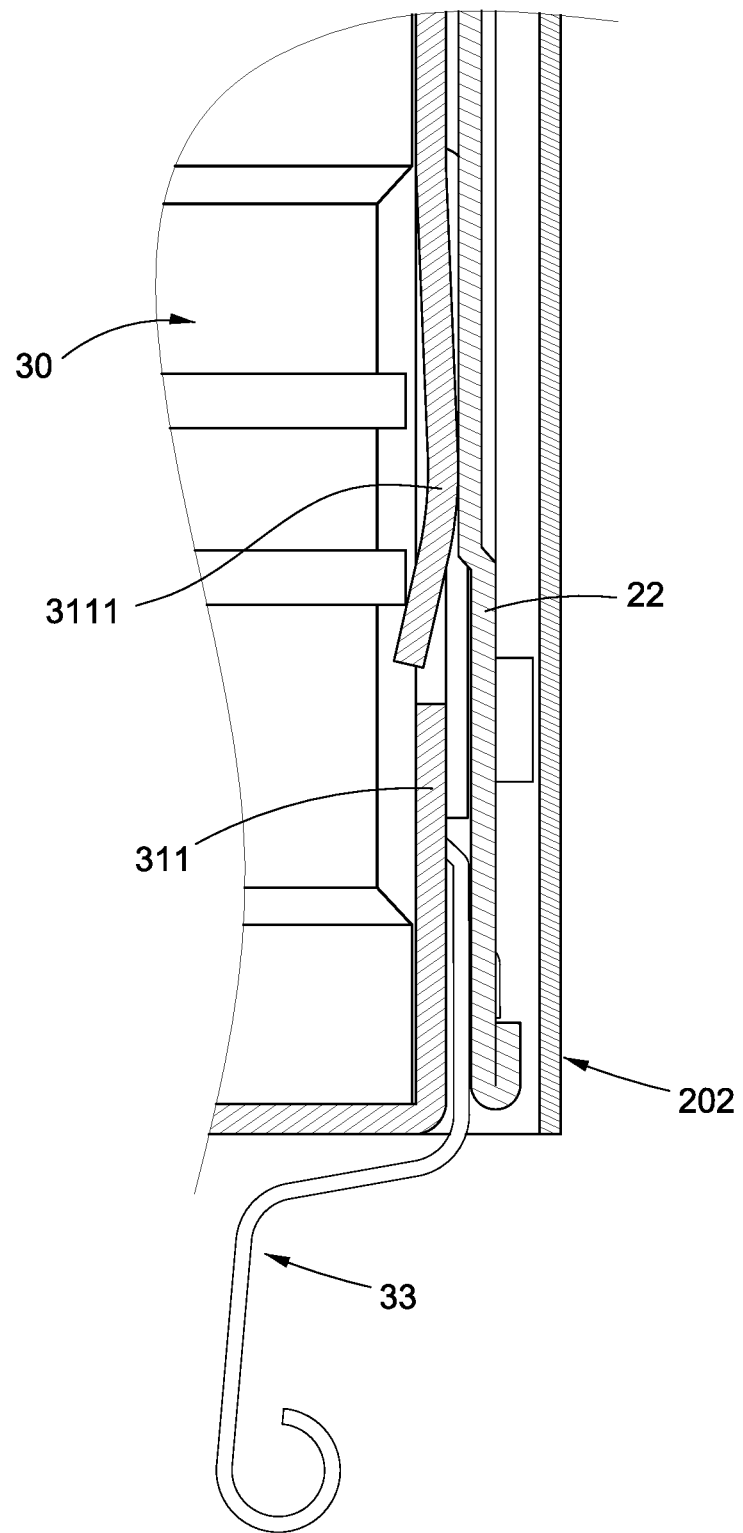

Please further refer to FIG. 7 and FIG. 8, which depict the cross-sectional views of the cabinet door and the fan module of this disclosure. In FIG. 7, when the elastic clip 33 is engaged with the snap hole 204 of the cabinet door 20, the snap hole 204 may not be seen from the outside of the cabinet door 20. As shown in FIG. 8, when the fan module 30 is placed into the cabinet door 20, the supporting tabs 3111 elastically abut against the supporting plate 22 of the cabinet door 20 to support the weight of the fan module 30.

Although this disclosure has been described with reference to the preferred embodiment thereof, it will be understood that the disclosure is not limited to the details thereof. Various substitutions and improvements have been suggested in the foregoing description, and others will occur to those of ordinary skill in the art. Therefore, all such substitutions and improvements are intended to be embraced within the scope of the disclosure as defined in the appended claims.

What is claimed is:

1. A telecommunication cabinet, comprising:
   a cabinet body, comprising a cabinet and a telecommunication module disposed in the cabinet;
   a cabinet door, covering the cabinet body, and comprising an inner side adjacent to the cabinet, an outer side opposite to the inner side, a plurality of coupling holes disposed on the inner side, a snap hole disposed on the outer side, and an installation opening disposed on a bottom side of the cabinet door;
   a fan module, comprising a supporting frame, a plurality of fans arranged in the supporting frame and at least one elastic clip, the supporting frame comprising a front side attached to the cabinet door and a rear side opposite to the front side, the elastic clip fixed on the front side of the supporting frame and a first bump is disposed on the elastic clip to engage the snap hole, and a plurality of frame holes disposed on the rear side of the supporting frame; and
   a plurality of coupling parts, inserted in each of the coupling holes and each of the frame holes separately;
   wherein, when the fan module is placed into the cabinet door from the installation opening, the elastic clip is pressed so that the first bump is positioned in the snap hole, the coupling parts are inserted in the frame holes from the coupling holes on the inner side of the cabinet door, and the fan module is coupled to the bottom side of the cabinet door.

2. The telecommunication cabinet according to claim 1, further comprising a pair of brackets connected on a rear side of the cabinet, and the telecommunication cabinet being attached through the pair of brackets.

3. The telecommunication cabinet according to claim 1, wherein the cabinet comprises a convex plate disposed on a top of the cabinet, and the convex plate protrudes to top of the cabinet door, and a gap is disposed between the convex plate and the cabinet door.

4. The telecommunication cabinet according to claim 1, wherein the supporting frame comprises a first supporting plate located on the front side, a second supporting plate located on the rear side and an air outlet plate connected between the first supporting plate and the second supporting plate, and the air outlet plate comprises a plurality of vent holes.

5. The telecommunication cabinet according to claim 4, wherein the first supporting plate comprises a plurality of supporting tabs disposed spacedly, and the supporting tabs elastically abut against the cabinet door.

6. The telecommunication cabinet according to claim 4, wherein a number of the elastic clip is two, and two elastic clips are spacedly disposed on the first supporting plate and located between any two supporting tabs.

7. The telecommunication cabinet according to claim 4, wherein the at least one elastic clip comprises a riveting section and a bending section, and the riveting section is fixed on the first supporting plate, and the bending section is provided with the first bump.

8. The telecommunication cabinet according to claim 7, wherein a pressing portion in a curved shape is disposed on an end of the bending section.

9. The telecommunication cabinet according to claim 4, wherein the supporting frame further comprises a mounting plate, and a fold section is disposed on a bottom side of the mounting plate, and the frame holes are disposed on the mounting plate.

10. The telecommunication cabinet according to claim 4, wherein the fans comprise an axial fan, and the vent holes of the air outlet plate are disposed correspondingly to an airflow direction of the fans.

11. The telecommunication cabinet according to claim 4, wherein a plurality of sustaining plates is disposed on the cabinet door, and the coupling holes are disposed on one of the sustaining plates in the inner side of the cabinet door, and the snap hole is disposed on one of the sustaining plates on the outer side of the cabinet door.

12. The telecommunication cabinet according to claim 11, wherein a plurality of second bumps is disposed on the second supporting plate, and a plurality of rails spacedly arranged are disposed on the sustaining plate located in the inner side of the cabinet door, and the fan module is assembled into the cabinet door through the second bumps and the rails.

13. The telecommunication cabinet according to claim 1, wherein a coupling tube is disposed in the inner side of the cabinet door with respect to each of the coupling holes, and the coupling parts comprise a spring screw, and the coupling parts are inserted in the coupling tube and movable relative to the cabinet door in a manner of attaching to the inner side.

* * * * *